United States Patent
Camras et al.

(10) Patent No.: US 9,583,683 B2
(45) Date of Patent: *Feb. 28, 2017

(54) LIGHT EMITTING DEVICES WITH OPTICAL ELEMENTS AND BONDING LAYERS

(71) Applicant: Lumileds LLC, San Jose, CA (US)

(72) Inventors: Michael D. Camras, Sunnyvale, CA (US); Michael R. Krames, Mountain View, CA (US); Wayne L. Snyder, Palo Alto, CA (US); Frank M. Steranka, San Jose, CA (US); Robert C. Taber, Palo Alto, CA (US); John J. Uebbing, Palo Alto, CA (US); Douglas W. Pocius, Sunnyvale, CA (US); Troy A. Trottier, San Jose, CA (US); Christopher H. Lowery, Fremont, CA (US); Gerd O. Mueller, San Jose, CA (US); Regina B. Mueller-Mach, San Jose, CA (US)

(73) Assignee: Lumileds LLC, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/136,171

(22) Filed: Dec. 20, 2013

(65) Prior Publication Data
US 2014/0191265 A1 Jul. 10, 2014

Related U.S. Application Data

(60) Continuation of application No. 13/252,398, filed on Oct. 4, 2011, now Pat. No. 8,628,985, which is a
(Continued)

(51) Int. Cl.
*H01L 33/00* (2010.01)
*H01L 33/58* (2010.01)
(Continued)

(52) U.S. Cl.
CPC ............ *H01L 33/58* (2013.01); *H01L 33/405* (2013.01); *H01L 33/20* (2013.01)

(58) Field of Classification Search
CPC ........ H01L 33/405; H01L 33/58; H01L 33/20
See application file for complete search history.

(56) References Cited

U.S. PATENT DOCUMENTS 3,676,668 A 7/1972 Collins et al.
3,769,536 A 10/1973 Antypas et al.
(Continued)

FOREIGN PATENT DOCUMENTS

DE 2209194 8/1973
DE 2209194 A1 8/1973
(Continued)

OTHER PUBLICATIONS

Patent Abstracts of Japan, Publication No. 09-153645, Date of Publication, Oct. 6, 1997, inventors Asami Shinya et al,.
(Continued)

*Primary Examiner* — Stephen W Smoot
*Assistant Examiner* — Vicki B Booker

(57) ABSTRACT

Light emitting devices with improved light extraction efficiency are provided. The light emitting devices have a stack of layers including semiconductor layers comprising an active region. The stack is bonded to a transparent optical element.

13 Claims, 5 Drawing Sheets

Related U.S. Application Data division of application No. 11/868,903, filed on Oct. 8, 2007, now Pat. No. 8,049,234, which is a continuation of application No. 10/938,237, filed on Sep. 10, 2004, now Pat. No. 7,279,345, which is a division of application No. 09/880,204, filed on Jun. 12, 2001, now Pat. No. 7,064,355, which is a continuation of application No. 09/660,317, filed on Sep. 12, 2000, now Pat. No. 7,053,419.

(51) Int. Cl.
*H01L 33/40* (2010.01)
*H01L 33/20* (2010.01)

(56) References Cited

U.S. PATENT DOCUMENTS

| | | |
|---|---|---|
| 3,932,881 A | 1/1976 | Mita et al. |
| 3,964,157 A | 6/1976 | Kuhn et al. |
| 4,109,054 A | 8/1978 | Burgyan |
| 4,391,683 A | 7/1983 | Buckley et al. |
| 4,675,058 A | 6/1987 | Plaster |
| 4,689,652 A | 8/1987 | Shimada et al. |
| 4,727,457 A | 2/1988 | Thillays |
| 4,783,347 A | 11/1988 | Doin et al. |
| 4,815,084 A | 3/1989 | Scifres et al. |
| 4,983,009 A | 1/1991 | Musk |
| 4,988,579 A | 1/1991 | Tomomura et al. |
| 4,993,817 A * | 2/1991 | Hoogland ........ G02B 23/2446 359/435 |
| 5,040,868 A | 8/1991 | Waitl et al. |
| 5,055,892 A | 10/1991 | Gardmer et al. |
| 5,130,531 A | 7/1992 | Ito et al. |
| 5,132,430 A | 7/1992 | Gaudiana et al. |
| 5,181,220 A | 1/1993 | Yagi |
| 5,255,171 A | 10/1993 | Clark |
| 5,255,333 A | 10/1993 | Althaus et al. |
| 5,300,788 A | 4/1994 | Fan et al. |
| 5,317,170 A | 5/1994 | Paoli |
| 5,376,580 A | 12/1994 | Kish et al. |
| 5,394,430 A | 2/1995 | Huang |
| 5,418,384 A | 5/1995 | Yamana et al. |
| 5,502,316 A | 3/1996 | Kish et al. |
| 5,528,057 A | 6/1996 | Yanagase et al. |
| 5,537,000 A | 7/1996 | Alivisatos et al. |
| 5,553,089 A | 9/1996 | Seki et al. |
| 5,661,316 A | 8/1997 | Kish et al. |
| 5,698,452 A | 12/1997 | Goossen |
| 5,724,376 A | 3/1998 | Kish, Jr. et al. |
| 5,777,433 A * | 7/1998 | Lester et al. ............. 313/512 |
| 5,779,924 A | 7/1998 | Krames et al. |
| 5,793,062 A | 8/1998 | Kish, Jr. et al. |
| 5,813,753 A | 9/1998 | Vriens et al. |
| 5,837,561 A | 11/1998 | Kish, Jr. et al. |
| 5,847,507 A | 12/1998 | Butterworth |
| 5,875,205 A | 2/1999 | Spaeth et al. |
| 5,898,185 A | 4/1999 | Bojarczuk, Jr. et al. |
| 5,917,201 A | 6/1999 | Ming-Jiunn et al. |
| 5,925,898 A | 7/1999 | Spath |
| 5,966,399 A | 10/1999 | Jiang et al. |
| 6,015,719 A | 1/2000 | Kish, Jr. et al. |
| 6,066,861 A | 5/2000 | Hohn et al. |
| 6,075,627 A | 6/2000 | Feldman et al. |
| 6,091,020 A | 7/2000 | Farbanks et al. |
| 6,091,694 A | 7/2000 | Spath |
| 6,155,699 A | 12/2000 | Miller et al. |
| 6,165,911 A | 12/2000 | Calveley |
| 6,214,733 B1 | 4/2001 | Sickmiller |
| 6,233,267 B1 | 5/2001 | Nurmikko et al. |
| 6,258,699 B1 | 7/2001 | Chang et al. |
| 6,294,800 B1 | 9/2001 | Duggal et al. |
| 6,319,619 B1 | 11/2001 | Yamamoto et al. |
| 6,329,676 B1 | 12/2001 | Takayama et al. |
| 6,340,824 B1 * | 1/2002 | Komoto et al. ............. 257/99 |
| 6,412,971 B1 | 7/2002 | Wojnarowski et al. |
| 6,429,462 B1 | 8/2002 | Shveykin |
| 6,469,785 B1 | 10/2002 | Duveneck et al. |
| 6,472,765 B1 | 10/2002 | Sano et al. |
| 6,473,554 B1 | 10/2002 | Pelka et al. |
| 6,483,196 B1 | 11/2002 | Wojnarowski et al. |
| 6,495,862 B1 | 12/2002 | Okasaki et al. |
| 6,501,091 B1 * | 12/2002 | Bawendi et al. ............. 257/14 |
| 6,598,998 B2 | 7/2003 | West et al. |
| 6,608,439 B1 | 8/2003 | Sokolik et al. |
| 6,709,883 B2 | 3/2004 | Yang et al. |
| 7,053,419 B1 | 5/2006 | Camras et al. |
| 7,064,355 B2 | 6/2006 | Camras et al. |
| 7,078,732 B1 | 7/2006 | Reeh et al. |
| 7,279,345 B2 | 10/2007 | Camras et al. |
| 7,332,746 B1 | 2/2008 | Takahashi et al. |
| 7,682,848 B2 | 3/2010 | Shimizu et al. |
| 2002/0030194 A1 | 3/2002 | Camras et al. |
| 2002/0141006 A1 | 10/2002 | Pocius et al. |
| 2003/0227249 A1 | 12/2003 | Mueller et al. |
| 2004/0051106 A1 | 3/2004 | Baur et al. |
| 2005/0269582 A1 | 12/2005 | Mueller et al. |
| 2010/0206362 A1 | 8/2010 | Flood |
| 2010/0309669 A1 | 12/2010 | Guzzini et al. |
| 2011/0297912 A1 | 12/2011 | Samachisa et al. |

FOREIGN PATENT DOCUMENTS

| | | |
|---|---|---|
| EP | 08090304 A2 | 11/1997 |
| EP | 0926744 A2 | 6/1999 |
| EP | 1119058 A | 7/2001 |
| EP | 1158585 A1 | 11/2001 |
| EP | 1191608 A2 | 3/2002 |
| JP | 50-110291 A | 8/1975 |
| JP | 53080988 | 7/1978 |
| JP | 35505473 | 5/1980 |
| JP | 56-69607 A | 6/1981 |
| JP | 61-096780 A | 5/1986 |
| JP | 61-187384 A | 8/1986 |
| JP | 63-188109 A | 3/1988 |
| JP | 01-161878 A | 6/1989 |
| JP | 01-230274 A | 9/1989 |
| JP | 01-293579 A | 11/1989 |
| JP | 02-119275 A | 5/1990 |
| JP | 05-37007 A | 2/1993 |
| JP | 05-090966 A | 4/1993 |
| JP | 05-129653 A | 5/1993 |
| JP | 05-113526 A | 7/1993 |
| JP | 05-343709 A | 12/1993 |
| JP | 06151972 | 5/1994 |
| JP | 06-296040 A | 10/1994 |
| JP | 06-302857 A | 10/1994 |
| JP | 07-038153 A | 7/1995 |
| JP | 07169994 | 7/1995 |
| JP | 08076697 | 3/1996 |
| JP | 0915645 | 6/1997 |
| JP | 09167515 A1 | 6/1997 |
| JP | 09172229 A | 6/1997 |
| JP | 10151794 | 9/1998 |
| JP | 10-341035 A | 12/1998 |
| JP | 11-170605 A | 6/1999 |
| JP | 11-204838 A | 7/1999 |
| JP | 11509687 A | 8/1999 |
| JP | 11-296184 A | 10/1999 |
| JP | 20000058913 A | 2/2000 |
| JP | 2001-28456 A | 1/2001 |
| JP | 2001-077430 A | 3/2001 |
| WO | 9704491 A1 | 2/1997 |
| WO | 9902026 A2 | 1/1999 |
| WO | 99/50916 A1 | 10/1999 |
| WO | 0069000 | 11/2000 |
| WO | 0070687 | 11/2000 |
| WO | 0180322 A2 | 4/2001 |
| WO | 0141219 A1 | 6/2001 |
| WO | 0141225 A2 | 6/2001 |
| WO | 0237578 A1 | 5/2002 |
| WO | 02056390 A1 | 7/2002 |

(56) References Cited

OTHER PUBLICATIONS

WO 00/6900, Translation From German, World Organization of Intellectual Property.
WO 00/70687, Translation From German, World Organization of Intellectual Property.
WO 01/80322A2, Translation From German, World Organization of Intellectual Property.
WO 02/37578 A21, Translation From German, World Organization of Intellectual Property.
Joshua Israelsohn, "Switching the Light Fantastic" Techtrends, EDN, Oct. 26, 2000.
Boris A. Matveey et al, "III-V Optically Pumped MID-IR LEDS" Light Emitting Diodes, Research Manufacturing and Applications, Proceedings of SPIE vol. 4278, (2001, pp. 186-196).
Thomas R. Anthony "Dielectric Isolation of Silicon by Anodic Bonding" J. Appl Phys. vol. 58, No. 3, Aug. 1985 p. 1240-1247.
Aluminum Oxide, A 1203 for Optical Coating, Cerac Inc. Technical Publications. p. 1-4.
Babic et al "Room Temperature Continuious-Wave Operation of 1-54UM Vertical Cavity Lasers" IEEE Photonics Technology Letters, vol. 7, No. 11, Nov. 1995, pp. 1225-1227.
Bulk Measurement, Sairon Technology, Inc. pp. 1-3.
Carr, "Photometric Figures of Merit for Semiconductor Luminescent Sources Operating in Spontanious Mode" Infrared Physics, 1966, vol. 6., pp. 1-19.
Chua et al, "Dielectrically-Bonded Long Wavelength Vertical Cavity Laser on GaAs Substrates Using Strain-Compensated Multiple Quantum Wells" IEEE Photonics Technology Letters, vol. 6, No. 12, Dec. 1994, p. 1400-1402.
Chiu et al "High Efficiency AlGaInP Light-Emitting Diodes" Semiconductor and Semimetals, vol. 64, Chapter 2, pp. 49-128.
Fischer et al, "Highly Refractive Glasses to Improve Electroluminescent Diode Efficiencies" Journal of the Electomechanical Society Solid State Science Dec. 1969, pp. 171801722.
J.W. Osenbach et al Low Cost/High Volume Laser Modules Using Silicon Optical Bench Technology, 1998, Electronic Components and Technology Conference, pp. 581-587.
Joseph S. Hayden, Passive and Active Characterization of Hybrid Glass Substrates for Telecommunicatin Applications, 8 Pages.
Mary T. Strzelecki et al, "Low Temperature Bonding of Glasses and Glass Ceramics" 8 Pages.
Robert D. Simpson et al, "Hybrid Glass Structures for Telecommunication Applications" 8 Pages.
Office Action mailed Feb. 9, 2016 from Japanese Application No. 2013-212920.
Office Action dated Nov. 27, 2009 from European Application No. 01203238.9.
European Search Report dated Mar. 25, 2009 from European Application No. 01203238.9.
Notification of Grounds for Refusal dated Jul. 7, 2011 from Japanese Application No. 2001-275227.
Decision for Final Rejection dated Aug. 16, 2012 from Japanese Application No. 2001-275227.
Notice of Preliminary Rejection dated Oct. 29, 2007 from Korean Application No. 2001-0055273.
Final Notice of Preliminary Rejection dated Aug. 24, 2011 from Korean Application No. 2001-0055273.
Notice of Preliminary Rejection dated Mar. 22, 2012 from Korean Application No. 2001-0055273.
Notice of Allowance dated Apr. 3, 2012 from Korean Application No. 2001-0055273.
Notice of Preliminary Rejection dated Mar. 22, 2012 from Korean Application No. 2011-0123498.
Notice of Allowance dated Oct. 11, 2012 from Korean Application No. 2011-0123498.
Notification of Grounds for Refusal dated Jul. 7, 2011 from Japanese Application No. 2001-321214.
Decision for Final Rejection dated Mar. 15, 2012 from Japanese Application No. 2001-321214.
Notification of Grounds for Refusal dated Apr. 10, 2013 from Japanese Application No. 2001-321214.
Notice of Preliminary Rejection dated Nov. 15, 2007 from Korean Patent Application No. 2001-0068054.
Notice of Allowance dated Nov. 2, 2009 from Korean Patent Application No. 2001-0068054.
European Search Report dated Mar. 25, 2009 from European Application No. 01204002.8.

\* cited by examiner

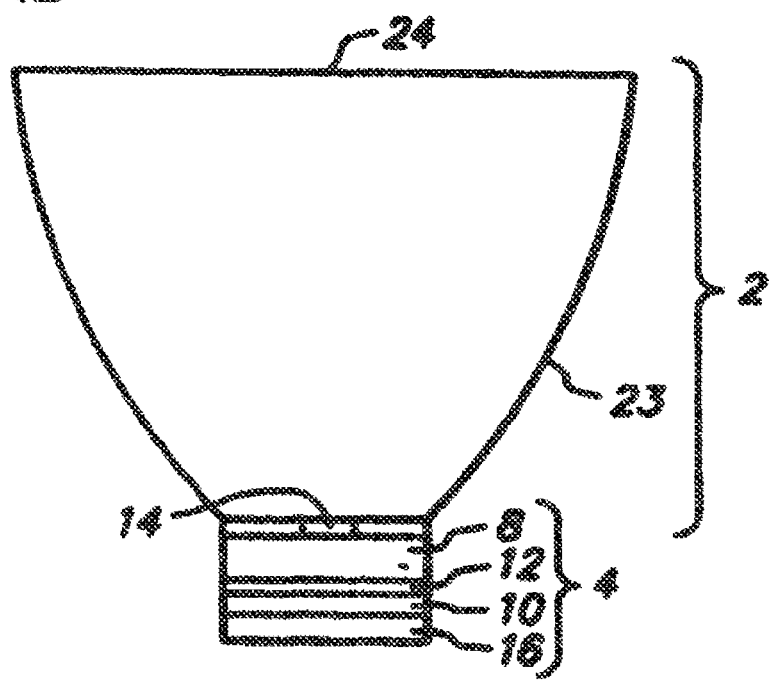

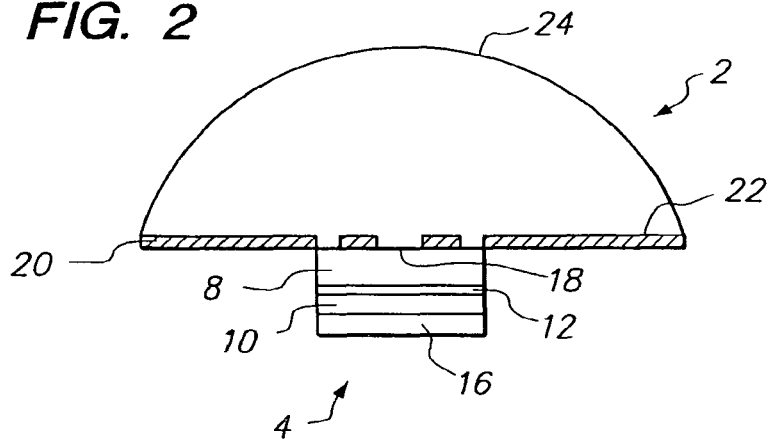
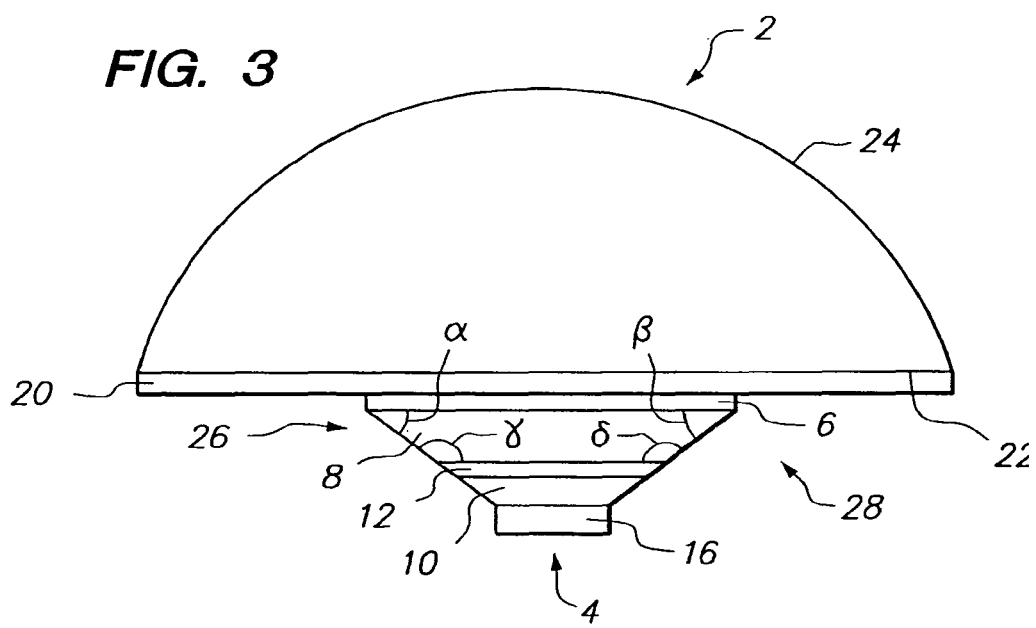
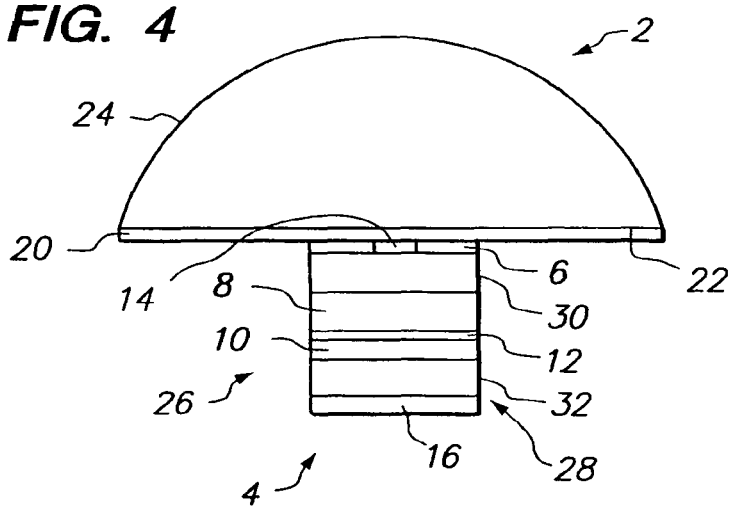

LIGHT EMITTING DEVICES WITH OPTICAL ELEMENTS AND BONDING LAYERS

CROSS REFERENCE TO RELATED APPLICATIONS

This application is a Continuation of U.S. patent application Ser. No. 13/252,398, filed on Oct. 4, 2011, now U.S. Pat. No. 8,628,985, issued on Jan. 14, 2014, which is a Division of U.S. patent application Ser. No. 11/868,903, filed on Oct. 8, 2007, now U.S. Pat. No. 8,049,234, which is a Continuation of U.S. patent application Ser. No. 10/938,237, filed on Sep. 10, 2004, now U.S. Pat. No. 7,279,345, which is a Division of U.S. patent application Ser. No. 09/880,204, filed on Jun. 12, 2001, now U.S. Pat. No. 7,064,355, which is a Continuation-In-Part of U.S. patent application Ser. No. 09/660,317 filed on Sep. 12, 2000, now U.S. Pat. No. 7,053,419. Each of U.S. patent application Ser. No. 13/252,398, U.S. Pat. Nos. 8,049,234, 7,279,345, 7,064,355, and 7,053,419 is incorporated herein by reference.

BACKGROUND

Field of Invention

The present invention relates generally to methods of forming light emitting devices with enhanced light extraction efficiency.

Description of Related Art

The light extraction efficiency of a light emitting diode (LED) is defined as the ratio of the LED's external quantum efficiency to the LED's internal quantum efficiency. Typically, the light extraction efficiency of a packaged LED is substantially less than one, i.e., much of the light generated in the LED's active region never reaches the external environment.

Light extraction efficiency is reduced by total internal reflection at interfaces between the LED and surrounding material followed by reabsorption of the totally internally reflected light in the LED. For example, for a cubic geometry LED on a transparent substrate encapsulated in epoxy, the refractive index (n) at the emission wavelength changes from a value of, for example, $n_{semi} \sim 3.5$ in the LED semiconductor to $n_{epoxy} \sim 1.5$ in the epoxy. The corresponding critical angle for total internal reflection of light incident on the epoxy encapsulant from the LED semiconductor of this example is $\theta_c = \arcsin(n_{epoxy}/n_{semi}) \sim 25°$. Neglecting scattering and multiple reflections, light emitted over $4\pi$ steradians from a point in the active region of the cubic LED crosses a semiconductor/epoxy encapsulant interface only if it is emitted into one of six narrow light cones, one for each interface, with each light cone having a half angle equal to the critical angle. Additional losses due to total internal reflection can occur at the epoxy/air interface. Consequently, an efficient conventional geometry (for example, rectangular parallelepiped) transparent substrate AlInGaP LED encapsulated in epoxy, for example, may have an external quantum efficiency of only ~40%, despite having an internal quantum efficiency of nearly 100%.

The effect of total internal reflection on the light extraction efficiency of LEDs is further discussed in U.S. Pat. Nos. 5,779,924; 5,793,062; and 6,015,719 incorporated herein by reference.

In one approach to improving light extraction efficiency, LEDs are ground into hemispherical shapes. Light emitted from a point in the active region of a hemispherically shaped LED intersects the hemispherical interface at near normal incidence. Thus, total internal reflection is reduced. However, this technique is tedious and wasteful of material. In addition, defects introduced during the grinding process may compromise the reliability and performance of the LEDs.

In another approach, LEDs are encapsulated (encased) in a material with a dome or hemispherically shaped surface. For example, the epoxy encapsulant of the above example may be dome shaped to reduce losses due to total internal reflection at the epoxy encapsulant/air interface. However, shaping the surface of a low refractive index encapsulant such as epoxy does not reduce losses due to total internal reflection at the semiconductor/low index encapsulant interface. Moreover, epoxy encapsulants typically have coefficients of thermal expansion that poorly match those of the semiconductor materials in the LED. Consequently, the epoxy encapsulant subjects the LED to mechanical stress upon heating or cooling and may damage the LED. LEDs are also encapsulated in dome shaped high index glasses, which increase the critical angle for the semiconductor/encapsulant interface. Unfortunately, optical absorption in high index glasses and mechanical stress typically degrade the performance of an LED encapsulated in such glass.

What is needed is a method for increasing the light extraction efficiency of light emitting diodes which does not suffer from the drawbacks of previous methods.

SUMMARY

Light emitting devices with improved light extraction efficiency are provided. The light emitting devices have a stack of layers including semiconductor layers comprising an active region. The stack is bonded to a transparent optical element.

In some embodiments, the optical element is a lens, for example a hemispheric lens or a Fresnel lens. In other embodiments, the optical element is an optical concentrator using, for example, a total internal reflector (TIR). The optical element is formed, for example, from optical glass, III-V semiconductors, II-VI semiconductors, group IV semiconductors and compounds, metal oxides, metal fluorides, diamond, sapphire, zirconium oxide, yttrium aluminum garnet, or combinations thereof. The refractive index of the optical element for light emitted from the active region is preferably greater than about 1.5, more preferably greater than about 1.8.

In one embodiment, the transparent optical element is directly bonded to at least one of the semiconductor layers of the stack. In another embodiment, the transparent optical element is directly bonded to a transparent superstrate disposed above the semiconductor layers. The transparent superstrate preferably has a refractive index for light emitted from the active region greater than about 1.8.

In other embodiments, the light emitting device includes a transparent bonding layer disposed between the optical element and a surface of the stack. The transparent bonding layer bonds the optical element to the surface of the stack. In one embodiment, the surface includes a surface of one of the semiconductor layers. In another embodiment, the surface includes a surface of a transparent superstrate layer disposed above the semiconductor layers. The transparent bonding layer is formed, for example, from metals, phosphide compounds, arsenide compounds, antimonide compounds, nitride compounds, or any of the materials listed above for the transparent optical element. In one embodiment, the transparent bonding material has an index of refraction for light emitted from the active region greater than about 1.5, preferably greater than about 1.8.

A method of bonding a transparent optical element to a light emitting device having a stack of layers including semiconductor layers comprising an active region is provided. The method includes elevating a temperature of the optical element and the stack and applying a pressure to press the optical element and the stack together. In one embodiment, the method also includes disposing a layer of a transparent bonding material between the stack and the optical element. The bonding method can be applied to a premade optical element or to a block of optical element material which is later formed or shaped into an optical element such as a lens or an optical concentrator.

Bonding a high refractive index optical element to a light emitting device improves the light extraction efficiency of the light emitting device by reducing loss due to total internal reflection. Advantageously, this improvement can be achieved without the use of an encapsulant.

BRIEF DESCRIPTION OF THE DRAWINGS

FIG. 1D is a schematic diagram of an optical concentrator bonded to a light emitting diode in accordance with another embodiment of the present invention.

FIG. 2 is a schematic diagram of an optical element directly bonded to a light emitting diode in accordance with an embodiment of the present invention.

FIG. 3 is a schematic diagram of an optical element bonded with a bonding layer to a light emitting diode having beveled sides in accordance with an embodiment of the present invention.

FIG. 4 is a schematic diagram of an optical element bonded with a bonding layer to a light emitting diode having substrate and superstrate layers in accordance with an embodiment of the present invention

DETAILED DESCRIPTION

Figure 1A:
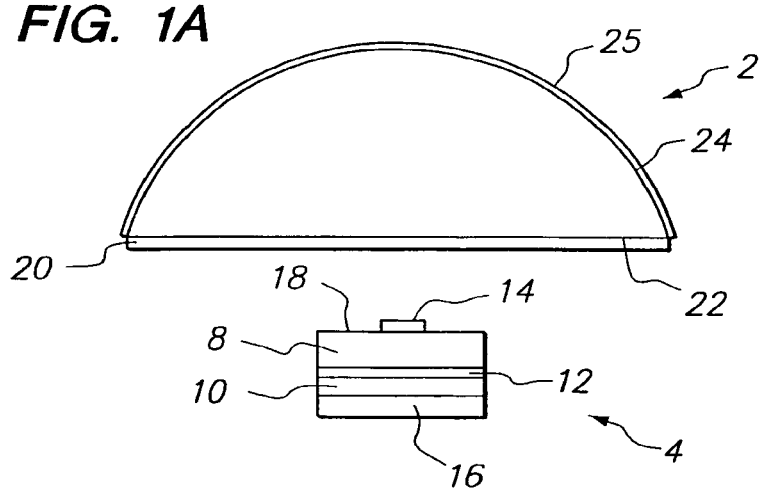
FIG. 1A is a schematic diagram of an optical element and a light emitting diode to be bonded to each other in accordance with an embodiment of the present invention.
Figure 1B:
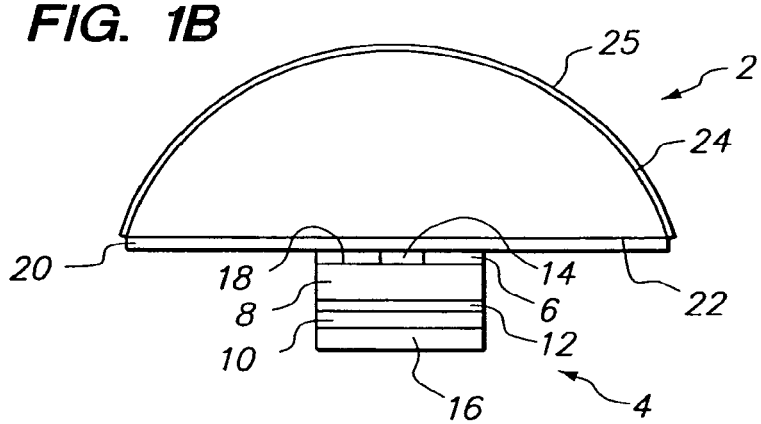
FIG. 1B is a schematic diagram of an optical element bonded with a bonding layer to a light emitting diode in accordance with an embodiment of the present invention.

FIG. 1A depicts a transparent optical element 2 and a light emitting diode (LED) die 4 to be bonded to each other in accordance with an embodiment of the present invention. In FIG. 1B, in accordance with one embodiment of the present invention, transparent optical element 2 is bonded to LED die 4 with a transparent bonding layer 6.

The term "transparent" is used herein to indicate that an optical element so described, such as a "transparent optical element," a "transparent bonding layer," "transparent substrate," or a "transparent superstate" transmits light at the emission wavelengths of the LED with less than about 50%, preferably less than about 10%, single pass loss due to absorption or scattering. The emission wavelengths of the LED may lie in the infrared, visible, or ultraviolet regions of the electromagnetic spectrum. One of ordinary skill in the art will recognize that the conditions "less than 50% single pass loss" and "less than 10% single pass loss" may be met by various combinations of transmission path length and absorption constant. As used herein, "optical concentrator" includes but is not limited to total internal reflectors, and includes optical elements having a wall coated with a reflective metal or a dielectric material to reflect or redirect incident light.

LED die 4 illustrated in FIGS. 1A and 1B includes a first semiconductor layer 8 of n-type conductivity (n-layer) and a second semiconductor layer 10 of p-type conductivity p-layer). Semiconductor layers 8 and 10 are electrically coupled to active region 12. Active region 12 is, for example, a p-n diode junction associated with the interface of layers 8 and 10. Alternatively, active region 12 includes one or more semiconductor layers that are doped n-type or p-type or are undoped. N-contact 14 and p-contact 16 are electrically coupled to semiconductor layers 8 and 10, respectively. Active region 12 emits light upon application of a suitable voltage across contacts 14 and 16. In alternative implementations, the conductivity types of layers 8 and 9, together with contacts 14 and 16, are reversed. That is, layer 8 is a p-type layer, contact 14 is a p-contact, layer 10 is an n-type layer, and contact 16 is an n-contact.

Semiconductor layers 8 and 10 and active region 12 are formed from III-V semiconductors including but not limited to AN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors have indices of refraction ranging from about 2.4 to about 4.1 at the typical emission wavelengths of LEDs in which they are present. For example, III-Nitride semiconductors such as GaN have refractive indices of about 2.4 at 500 nm, and III-Phosphide semiconductors such as InGaP have refractive indices of about 3.7 at 600 nm.

Contacts 14 and 16 are, in one implementation, metal contacts formed from metals including but not limited to gold, silver, nickel, aluminum, titanium, chromium, platinum, palladium, rhodium, rhenium, ruthenium, tungsten, and mixtures or alloys thereof. In another implementation, one or both of contacts 14 and 16 are formed from transparent conductors such as indium tin oxide.

Although FIGS. 1A and 1B illustrate a particular LED structure, the present invention is independent of the number of semiconductor layers in LED die 4, and independent of the detailed structure of active region 12. Also, LED die 4 may include, for example, transparent substrates and superstrates not illustrated in FIGS. 1A and 1B. It should be noted that dimensions of the various elements of LED die 4 illustrated in the various figures are not to scale.

In one embodiment, a layer of bonding material is applied to a top surface 18 of LED die 4 (FIG. 1A) to form transparent bonding layer 6 (FIG. 1B) with which to bond optical element 2 to LED die 4. Transparent bonding layer 6 is, for example, about 10 Angstroms (Å) to about 100 microns (μm) thick. The bonding material is applied, for example, by conventional deposition techniques including but not limited to spinning, sputtering, evaporation, chemical vapor deposition (CVD), or as part of material growth by, for example, metal-organic chemical vapor deposition (MOCVD), vapor phase epitaxy (VPE), liquid phase epitaxy (LPE), or molecular beam epitaxy (MBE). Transparent bonding layer 6 is optionally patterned with, for example, conventional photolithographic and etching techniques to leave contact 14 uncovered by bonding material and thus to permit contact 14 to make electrical contact with optional metallization layer 20 on optical element 2. Metallization layer 20, in one embodiment a mesh and in other embodiments a continuous or patterned layer, for example, about 2 Å to about 5000 Å thick, transmits greater than about 10%, preferably greater than about 50%, of incident light and provides a physically accessible electrical contact coupled to contact 14. Metallization layer 20 is formed, for example, from metals or transparent conductors such as indium tin oxide.

Figure 1C:
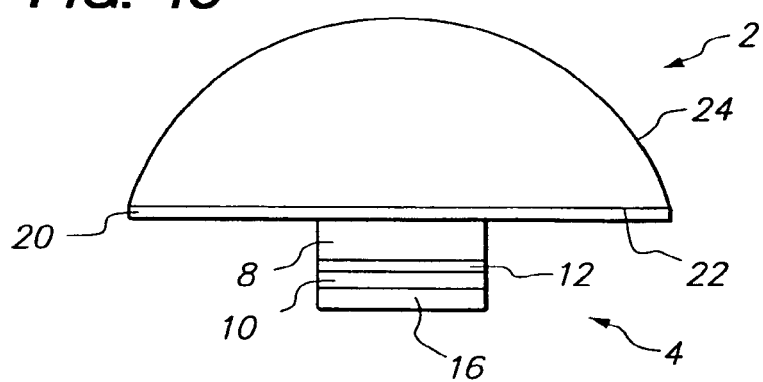
FIG. 1C is a schematic diagram of an optical element bonded to a light emitting diode in accordance with another embodiment of the present invention.

In an alternative embodiment, transparent bonding layer 6 is formed on substantially flat surface 22 of optical element 2 or on the surface of metallization layer 20 and optionally patterned with, for example, conventional photolithographic and etching techniques to permit electrical contact between contact 14 and metallization layer 20. In another embodiment transparent bonding layers such as bonding layer 6 are formed on both surface 18 of LED die 4 and surface 22 of optical element 2. In other embodiments, contact 14 is not separately provided, and bonding layer 6 is patterned to permit electrical contact between metallization layer 20 and n-layer 8. In the embodiment shown in FIG. 1C, neither contact 14 nor bonding layer 6 is separately provided, and metallization layer 20 additionally functions as a bonding layer. In other embodiments, contact 14 is not located on surface 18 and the metallization layer 20 is not used.

Though the following discussion assumes that bonding layer 6 is formed on LED die 4 rather than on surface 22 of optical element 2 or on both LED die 4 and surface 22, the process described below can be simply modified to implement the latter embodiments.

In one implementation, the bonding material from which transparent bonding layer 6 is formed is a high index optical glass, i.e, an optical glass having a refractive index greater than about 1.5 in the range of wavelengths emitted by active region 12. Preferably, the refractive index is greater than about 1.8. Transparent bonding layer 6 is formed, for example, from Schott glass SF59, a dense flint glass which has refractive index (n)~1.95 at ~600 nanometers (nm) and a glass transition temperature ($T_G$)~362° C. Alternatively, transparent bonding layer 6 is formed from high index optical glasses including but not limited to Schott glass LaSF 3, with n~1.81 at ~600 nm and $T_G$~630° C.; Schott glass LaSF N18, with n~1.91 at ~600 nm and $T_G$~660° C.; and mixtures thereof. These glasses are available from Schott Glass Technologies Incorporated, of Duryea, PA.

Bonding layer 6 may also be formed from a high index chalcogenide glass, such as (Ge,Sb,Ga)(S,Se) chalcogenide glasses, for example.

In other implementations, bonding layer 6 is formed from III-V semiconductors including but not limited to GaP (n~3.3 at 600 rim), InGaP (n~3.7 at 600 nm), GaAs (n~3.4 at 500 nm), and GaN(n~2.4 at 500 nm); II-VI semiconductors including but not limited to ZnS (n~2.4 at 500 nm), ZnSe (n~2.6 at 500 nm), ZnTe (n~3.1 at 500 nm), CdS (n~2.6 at 500 nm), CdSe (n~2.6 at 500 nm), and CdTe (n~2.7 at 500 nm); group IV semiconductors and compounds including but not limited to Si (n~3.5 at 500 nm), and Ge (n~4.1 at 500 nm); organic semiconductors, metal oxides including but not limited to tungsten oxide, titanium oxide (n~2.9 at 500 nm), nickel oxide (n~2.2 at 500 nm), zirconium oxide (n~2.2 at 500 nm), indium tin oxide, and chromium oxide; metal fluorides including but not limited to magnesium fluoride (n~1.4 at 500 nm) and calcium fluoride (n~1.4 at 500 nm); metals including but not limited to Zn, In, Mg, and Sn; yttrium aluminum garnet (YAG), phosphide compounds, arsenide compounds, antimonide compounds, nitride compounds, high index organic compounds; and mixtures or alloys thereof.

Bonding layer 6 includes, in one implementation, luminescent material that converts light of wavelengths emitted by active region 12 to other wavelengths. The luminescent material includes, for example, conventional phosphor particles, organic semiconductors, II-VI or III-V semiconductors, II-VI or III-V semiconductor quantum dots or nanocrystals, dyes, polymers, and materials such as GaN that luminesce from defect centers. If bonding layer 6 includes conventional phosphor particles, then bonding layer 6 should be thick enough to accommodate particles typically having a size of about 5 microns to about 50 microns.

In one implementation, bonding layer 6 is formed from a high index material (refractive index at the LED's emission wavelengths greater than about 1.5, preferably greater than about 1.8) having a refractive index less than that of the top layer of LED die 4, for example, semiconductor layer 8. Hence, a critical angle exists for total internal reflection of light incident on the semiconductor layer 8/bonding layer 6 interface from inside LED die 4. This critical angle is increased compared to the critical angle for an interface between LED die 4 and epoxy or air, however, and more light is extracted through surface 18 into bonding layer 6 than would be extracted into an epoxy encapsulant or air. In another implementation, the refractive index of bonding layer 6 (for example, ZnS or ZnSe) is greater than or equal to that of semiconductor layer 8 (for example, GaN), and none of the light incident on bonding layer 6 from inside LED die 4 is totally internally reflected. Neglecting Fresnel reflection losses, which can be minimized by approximately matching the refractive indices of bonding layer 6 and the top layer of LED die 4, in the latter case also more light is extracted through surface 18 into bonding layer 6 than would be extracted into an epoxy encapsulant or air.

In another implementation, transparent bonding layer 6 is formed from a low index bonding material, i.e., a bonding material having a refractive index less than about 1.5 at the LED's emission wavelengths. Magnesium fluoride, for example, is one such bonding material. Low index optical glasses, epoxies, and silicones may also be suitable low index bonding materials. One of ordinary skill in the art will recognize that efficient transmission of light from LED die 4 across transparent bonding layer 6, formed from a low index material, to optical element 2 can be achieved if bonding layer 6 is sufficiently thin. Accordingly, in this implementation losses due to total internal reflection at the LED die 4/bonding layer 6 interface are reduced by making the thickness of bonding layer 6 less than about 500 Å, preferably less than about 100 Å. Optical element 2 might bond poorly to LED die 4 if the roughness of surface 18 or surface 22 or typical height of irregularities on surface 18 or surface 22 exceed the thickness of bonding layer 6. In this embodiment, surfaces 18 and 22 are optionally polished to achieve a surface roughness of magnitude less than or equal to the thickness of bonding layer 6.

If LED die 4 includes material that absorbs light emitted by active region 12, and if bonding layer 6 is formed from a low index material but is not thin as described above, then a large portion of the light emitted by active region 12 will typically be trapped in LED die 4 and lost to absorption even if bonding layer 6 is itself nonabsorbing. In contrast, a bonding layer 6 formed from a high index material will typically couple a larger fraction of light emitted by active region 12 out of LED die 4 into optical element 2, even if the high index bonding material is a material such as a chalcogenide glass, for example, which absorbs a portion of the emitted light.

After transparent bonding layer 6 is applied to LED die 4, the substantially flat surface 22 of optical element 2 is placed against bonding layer 6. The temperature of bonding layer 6 is then raised to a temperature between about room temperature and about 1000° C., and optical element 2 and LED die 4 are pressed together for a period of time of about one second to about 6 hours at a pressure of about 1 pound per square inch (psi) to about 6000 psi. The inventors believe that in this process optical element 2 is bonded to LED die 4 by a bond effected between optical element 2 and bonding layer 6 (formed on LED die 4) by, for example, material transfer via shear stress, evaporation-condensation, liquification (or melting or softening) followed by solidification, diffusion, or alloying. The inventors believe that in other implementations optical element 2 is bonded to LED die 4 by a bond similarly effected by, for example, material transfer between bonding layers formed on each of optical element 2 and LED die 4 or between bonding layer 6 (formed on optical element 2) and LED die 4. Thus, a bonded interface characterized by material transfer may be disposed between optical element 2 and LED die 4. In one implementation, for example, surface 18 at the interface of n-layer 8 and bonding layer 6 is such a bonded interface. In another implementation, an interface of bonding layers formed on each of optical element 2 and LED die 4 is a bonded interface. In another implementation, an interface of optical element 2 and bonding layer 6 is a bonded interface.

If transparent bonding layer 6 is formed on LED die 4 from an optical glass, for example, then in one implementation the temperature of bonding layer 6 is raised to about the strain point temperature of the optical glass. The strain point temperature, which is near to but less than the glass transition temperature ($T_G$), is the temperature at which the optical glass has a viscosity of about $10^{14.5}$ poises. The strain point temperature also corresponds to the first nonlinearity in a plot of expansion versus temperature for the optical glass, and thus represents the lower limit of the annealing range. The resulting flexibility and lowered surface tension of the optical glass in layer 6 at temperatures near or above the strain point temperature allow the optical glass to microscopically conform to surface 22 and to effect a bond between optical element 2 and bonding layer 6.

The process of bonding optical element 2 to LED die 4 described above may be performed with devices disclosed in U.S. Pat. Nos. 5,502,316 and 5,376,580, incorporated herein by reference, previously used to bond semiconductor wafers to each other at elevated temperatures and pressures. The disclosed devices may be modified to accommodate LED dice and optical elements, as necessary. Alternatively, the bonding process described above may be performed with a conventional vertical press.

Transparent optical element 2 is formed, for example, from SiC (n~2.7 at 500 nm), aluminum oxide (sapphire, n~1.8 at 500 nm), diamond (n~2.4 at 500 nm), or any of the materials listed above for use as bonding materials in transparent bonding layer 6, excluding the metals. A severe mismatch between the thermal expansion coefficients of optical element 2 and LED die 4 to which optical element 2 is bonded can cause optical element 2 to detach from LED die 4 upon heating or cooling. Also, approximately matching thermal expansion coefficients reduces the stress induced in LED die 4 by bonding layer 6 and optical element 2. Hence, in one implementation optical element 2 is formed from a material having a thermal expansion coefficient approximately matching the thermal expansion coefficient of LED die 4 to which optical element 2 is bonded.

In one embodiment, transparent optical element 2 has a shape and a size such that light entering optical element 2 from LED die 4 will intersect surface 24 of optical element 2 at angles of incidence near normal incidence. Total internal reflection at the interface of surface 24 and the ambient medium, typically air, is thereby reduced. In addition, since the range of angles of incidence is narrow, Fresnel reflection losses at surface 24 can be reduced by applying a conventional antireflection coating 25 to surface 24. The shape of optical element 2 is, for example, a portion of a sphere such as a hemisphere, a Weierstrass sphere (truncated sphere), or a portion of a sphere less than a hemisphere. Alternatively, the shape of optical element 2 is a portion of an ellipsoid such as a truncated ellipsoid. The angles of incidence at surface 24 for light entering optical element 2 from LED die 4 more closely approach normal incidence as the size of optical element 2 is increased. Hence, the smallest ratio of a length of the base of transparent optical element 2 to a length of the surface 18 of LED die 4 is preferably greater than about 1, more preferably greater than about 2.

One of ordinary skill in the art will recognize that the maximum size for which an optical element 2 of a particular material continues to be transparent as defined above is determined by the absorption constant of the optical element material at the emission wavelengths of the LED. In one implementation, optical element 2 is a Fresnel lens. Fresnel lenses are typically thinner than, for example, spherical optical elements of comparable focal lengths, and hence are less absorptive.

In some implementations, optical element 2 includes an optical concentrator, for example an optical concentrator using a total internal reflector (TIR). FIG. 1D provides an example of an optical concentrator bonded to LED die 4. Although FIG. 1D depicts surface 23 of the optical concentrator (optical element 2) as having a parabolic shape, surface 23 may have any shape designed to concentrate light, such as a cone-shape or a beveled shape, and may be coated with metallization or a dielectric material. Active layer 12 of LED die 4 is positioned to reduce the amount of light that experiences total internal reflection at surface 24. For example, active layer 12 may be distributed about the focal point of optical element 2. A photon which would have intersected surface 24 at an angle greater than the critical angle in the absence of surface 23 intersects surface 24 at an angle within the critical angle if it first reflects off surface 23. Therefore, surface 23 increases the likelihood of a photon escaping LED die 4.

In yet another implementation, optical element 2 is a graded index optical element having, for example, a refractive index decreasing in the direction perpendicular to surface 22 or decreasing radially from a maximum near a center of surface 22.

Optical element 2 includes, in one implementation, luminescent material that converts light of wavelengths emitted by active region 12 to other wavelengths. In another implementation, a coating on surface 22, for example, includes luminescent material. The luminescent material includes, for example, conventional phosphor particles, organic semiconductors, II-VI or III-V semiconductors, II-VI or II-V semiconductor quantum dots or nanocrystals, dyes, polymers, and materials such as GaN that luminesce from defect centers. Alternatively, a region of optical element 2 near surface 22 is doped, for example, with a luminescent material.

The magnitudes of the refractive indices of optical element 2 ($n_{optical\ element}$), bonding layer 6 ($n_{bond}$), and the top layer of LED die 4 ($n_{LED}$) can be ordered in six permutations. If $n_{LED} \leq n_{bond} \leq n_{optical\ element}$ or $n_{LED} \leq n_{optical\ element} \leq n_{bond}$, then losses due to total internal reflection are eliminated, but Fresnel losses may occur. In particular, if $n_{LED} = n_{bond} = n_{optical\ element}$, then light enters optical element 2 from LED die 4 without losses due to Fresnel or total internal reflection. Alternatively, if $n_{bond} \leq n_{LED} \leq n_{optical\ element}$ but either $n_{bond} > n_{epoxy}$ or bonding layer 6 is thin as described above, then, neglecting Fresnel reflection losses, more light is extracted into optical element 2 than would be extracted into an epoxy encapsulant or air. Similarly, if $n_{bond} \leq n_{optical\ element} \leq n_{LED}$ but either $n_{bond} > n_{epoxy}$ or bonding layer 6 is thin as described above and $n_{optical\ element} > n_{epoxy}$, then, neglecting Fresnel reflection losses, more light is extracted into optical element 2 than would be extracted into an epoxy encapsulant or air. If $n_{optical\ element} \leq n_{bond} \leq n_{LED}$ or $n_{optical\ element} \leq n_{LED} \leq n_{bond}$ but $n_{optical\ element} > n_{epoxy}$, then, neglecting Fresnel reflection losses, more light is extracted into optical element 2 than would be extracted into an epoxy encapsulant or air. Thus, transparent optical element 2 preferably has a refractive index at the emission wavelengths of LED die 4 greater than about 1.5, more preferably greater than about 1.8. A similar analysis applies if the ambient medium is air ($n_{air} \sim 1$) rather than an epoxy encapsulant, with $n_{air}$ substituted for $n_{epoxy}$.

If bonding layer 6 includes phosphor particles and the refractive index of the bonding material, preferably a high index chalcogenide glass, approximately matches the refractive index of the phosphor particles, then scattering by the phosphor particles of light emitted by the active region or by the phosphor particles will be negligible. Preferably, the refractive indices of the phosphor particles, the bonding material, the top layer (for example n-layer 8) of LED die 4, and the optical element are all about equal. This is the case if the top layer of LED die 4 is TnGaN, the phosphor particles are SrS:Eu and/or SrGaS:Eu, and the optical element is ZnS.

Referring to FIG. 2, in an alternative embodiment transparent optical element 2 is bonded directly to a top surface 18 of LED die 4 without the use of a separate bonding layer. The inventors believe that a bond is effected between optical element 2 and LED die 4 by, for example, material transfer via shear stress, evaporation-condensation, liquification (or melting or softening) followed by solidification, diffusion, or alloying. Metallization layer 20, if present, is patterned to allow surface 22 of optical element 2 to directly contact surface 18. Surface 22 is optionally also patterned by etching, for example. In one implementation of this embodiment, transparent optical element 2 is formed from a material, such as those listed above, which could be used to form a separate bonding layer. In another implementation, the material from which the top layer of LED die 4 (for example, n-layer 8 in FIG. 2) is formed is suitable as a bonding material. Thus either optical element 2 or a top layer of LED die 4 functions additionally as a bonding layer, and no separate bonding layer is necessary. In one implementation, the interface of optical element 2 and LED die 4 at surface 18, for example, is a bonded interface characterized by mass transfer between optical element 2 and LED die 4.

For optical element 2 directly bonded to LED die 4, if $n_{LED} \leq n_{optical\ element}$ or if $n_{optical\ element} \leq n_{LED}$ but $n_{optical\ element} > n_{epoxy}$, then, neglecting Fresnel reflection losses, more light is extracted into optical element 2 than would be extracted into an epoxy encapsulant. A similar analysis applies if the ambient medium is air ($n_{air} \sim 1$) rather than an epoxy encapsulant, with $n_{air}$ substituted for $n_{epoxy}$.

Transparent optical element 2 is directly bonded to LED die 4 at temperatures and pressures as described above for the bonding process utilizing bonding layer 6. In one implementation, surface 18 of LED die 4 or surface 22 of optical element 2 is doped with a material exhibiting a high diffusivity such as, for example, Zn or Si. Such doping can be accomplished during materials growth by MOCVD, VPE, LPE or MIBE, for example, or after materials growth by, for example, implantation. In another implementation, a thin layer of a high diffusivity material is disposed between optical element 2 and LED die 4 by deposition on at least one of surfaces 18 and 22. Deposition can be accomplished, for example, by conventional means such as evaporation or sputtering. The inventors believe that during the bonding process the high diffusivity material diffuses across the interface between optical element 2 and LED die 4 and enhances material transfer between optical element 2 and LED die 4. The amount of high diffusivity material used should be sufficiently low to maintain the transparency of, for example, optical element 2 and the top layer of LED die 4.

Application of the bonding method is not limited to a pre-made optical element. Rather, transparent optical element 2 may be a block of transparent optical element material that is bonded to LED die 4 in the manner described above, and then formed into optical element 2. Optical element 2 may be formed using etching, perhaps in conjunction with photolithography or other lithographic techniques, electron beam lithography, ion beam lithography, X-ray lithography, or holographic lithography. Wet or dry chemical etching techniques such as plasma etching, reactive ion etching (RIE), and chemically-assisted ion beam etching (CAIBE) may be used as well. Also, optical element 2 may be milled into a surface of the transparent optical element material using ion beam milling or focused ion beam milling (FIB), ablated into the surface with a scanning electron or a laser beam, or mechanically machined into the surface by sawing, milling, or scribing. In addition, optical element 2 may be stamped into the block of transparent optical element material using the method disclosed in U.S. patent application Ser. No. 09/823,841 which is herein incorporated by reference.

It is advantageous to bond LED die 4 to optical element 2 rather than to conventionally encase LED die 4 in an encapsulant. For example, the light extraction efficiency through surface 18 of LED die 4 bonded to optical element 2 with or without bonding layer 6, as described above, is improved compared to a conventional epoxy encapsulated LED. In addition, LED die 4 need not be subject to the damaging stress experienced by epoxy encapsulated (encased) LEDs. Moreover, in the absence of epoxy encapsulants, which degrade at relatively low temperatures, LED die 4 can be run at higher temperatures. Consequently, the light output of LED die 4 can be increased by running the LED at higher current densities.

If desired, however, LED die 4 bonded to optical element 2 could be additionally encapsulated in, for example, epoxy or silicone. Such encapsulation of LED die 4 bonded to optical element 2 would not effect the light extraction efficiency through surface 18 of LED die 4 into optical element 2. Total internal reflection at the interface of surface 24 and the encapsulant would be minimized, as described above, by die shape and size of optical element 2.

In some implementations, LED die 4 includes, for example, metallization for electrical contacts that degrades at elevated temperatures. In other implementations, LED die 4 is bonded to a submount, not shown, with solders or silver bearing die-attach epoxies that degrade at high temperatures. (Note that die-attach epoxy is to be distinguished from an epoxy encapsulant.) Consequently, in one implementation the process of bonding optical element 2 to LED die 4, with or without a bonding layer 6, occurs at temperatures less than about 500° C. in order to avoid, for example, degrading the metallization or the die-attach epoxy. In another implementation, optical element 2 is bonded to an incomplete LED die, for example, an LED die missing some or all metallization. In the latter implementation, fabrication of the LED die is completed after the optical element bonding process.

As FIGS. 3, 4, 5, 6, 7, 8, 9, 10, and 11 illustrate, the structure of LED die 4 may differ from the structure depicted in FIGS. 1A, 1B, 1C, 1D, and 2. Like reference numbers in FIGS. 1A, 1B, 1C, 1D, 2, 3, 4, 5, 6, 7, 8, 9, 10, and 11 designate the same parts in the various embodiments.

In the embodiment of FIG. 3, sides 26 and 28 of LED die 4 are beveled such that they intersect bonding layer 6 at angles α and β, respectively, less than 90° and intersect active region 12 at angles γ and δ, respectively, greater than 90°. Though two beveled sides are shown in FIG. 3, in other embodiments LED die 4 has more or less than two beveled sides and is, for example, substantially conical or pyramidal in shape.

Beveled sides 26 and 28 reflect light emitted from active region 12 toward bonding layer 6. Light that might otherwise have been trapped in LED die 4 or lost out the sides of the die is thereby advantageously extracted through bonding layer 6 and optical element 2. In one embodiment, LED die 4 is surrounded by a low refractive index medium such as air, and a portion of the light incident on beveled sides 26 and 28 from active region 12 is totally internally reflected toward bonding layer 6. In another embodiment, beveled sides 26 and 28 are coated with a reflective coating, in one implementation a metal layer and in another implementation a dielectric layer, that reflects light toward bonding layer 6.

In one embodiment, contact 16 is highly reflective. Accordingly, in this embodiment light incident on contact 16 is reflected toward bonding layer 6 and optical element 2 either directly or after additional reflection from side 26 or side 28. The light extraction efficiency of LED die 4 is consequently increased.

Figure 5:
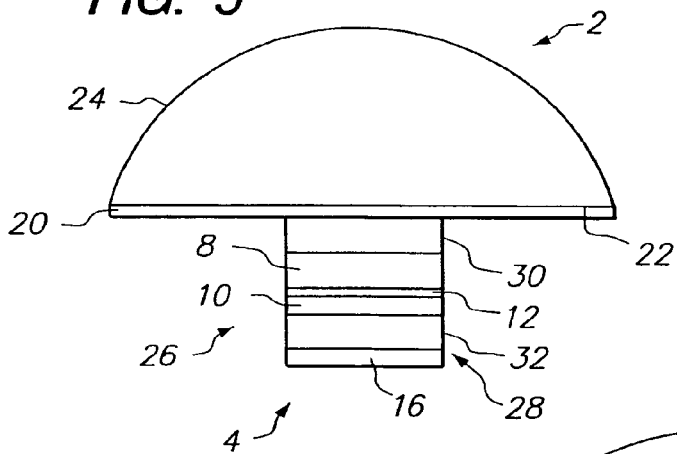
FIG. 5 is a schematic diagram of an optical element directly bonded to a light emitting diode having substrate and superstrate layers in accordance with an embodiment of the present invention

In the embodiments illustrated in FIGS. 4 and 5, LED die 4 includes conducting transparent superstate 30 electrically coupled to metallization layer 20 and electrically coupled to n-layer 8, and conducting, optionally transparent, substrate 32 electrically coupled to p-layer 10 and to contact 16. Superstrate 30 and (optionally) substrate 32 are formed, for example, from semiconductors having a band gap energy greater than the energy of photons emitted by LED die 4. Superstrate 30 is formed from a material having an index of refraction at the emission wavelengths of active region 12 preferably greater than about 1.5, more preferably greater than about 1.8. In other implementations, sides 26 and 28 of LED die 4 are beveled and highly reflective and contact 16 is highly reflective, as described above. In the embodiment illustrated in FIG. 4, transparent optical element 2 is bonded to superstrate 30 with bonding layer 6, and p-layer 8 is electrically coupled to metallization layer 20 by n-contact 14. In the embodiment illustrated in FIG. 5, transparent optical element 2 is directly bonded to superstrate 30 and re-contact 14 is not separately provided.

Figure 6:
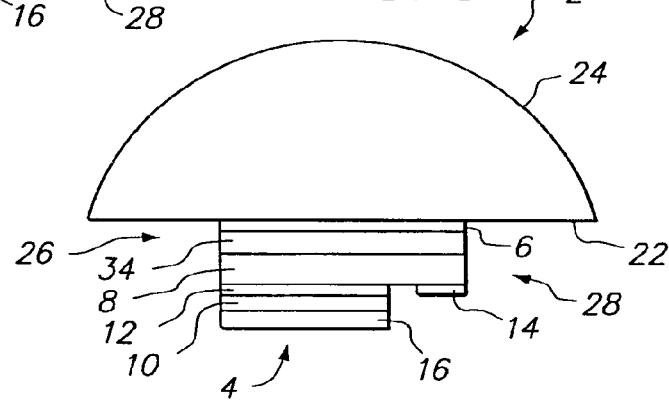
FIG. 6 is a schematic diagram of an optical element bonded with a bonding layer to a light emitting diode having a "flip chip" geometry in accordance with an embodiment of the present invention.
Figure 7:
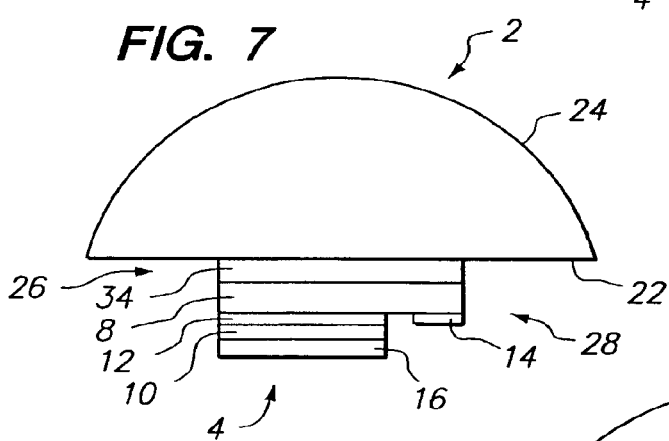
FIG. 7 is a schematic diagram of an optical element directly bonded to a light emitting diode having a "flip chip" geometry in accordance with an embodiment of the present invention.

Contact 14 and contact 16 are disposed on the same side of LED die 4 in the "flip chip" embodiments illustrated in FIGS. 6 and 7. Since optical element 2 is bonded to the opposite side of LED die 4 from contacts 14 and 16, no metallization layer is required on optical element 2 in these embodiments. The light extraction efficiency into optical element 2 is improved by the absence of the metallization layer. In other implementations, sides 26 and 28 of LED die 4 are beveled and highly reflective and contact 16 is highly reflective, as described above. Transparent superstrate 34 is formed from a material such as, for example, sapphire, SiC, GaN, or GaP, having an index of refraction at the emission wavelengths of active region 12 preferably greater than about 1.5, more preferably greater than about 1.8. In the embodiment illustrated in FIG. 6, optical element 2 is bonded with bonding layer 6 to transparent superstrate 34. In the embodiment illustrated in FIG. 7, optical element 2 is directly bonded to transparent superstrate 34.

In one implementation of the embodiments illustrated in FIGS. 6 and 7, optical element 2 is formed from ZnS, superstrate 34 is formed from SiC or GaN, and n-layer 8 is formed from a III-Nitride semiconductor such as GaN. In another implementation, optical element 2 is formed from GaP, superstrate 34 is formed from GaP, and n-layer 8 is formed from a III-Phosphide semiconductor such as an AlInGaP alloy. If present, transparent bonding layer 6 is formed, for example, from ZnS.

Figure 8:
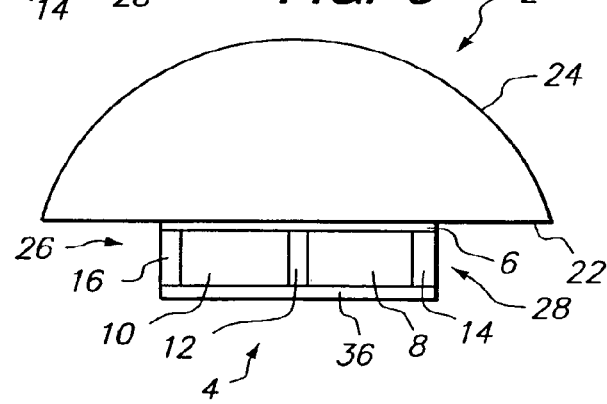
FIG. 8 is a schematic diagram of an optical element bonded with a bonding layer to a light emitting diode having an active region substantially perpendicular to the optical element.
Figure 9:
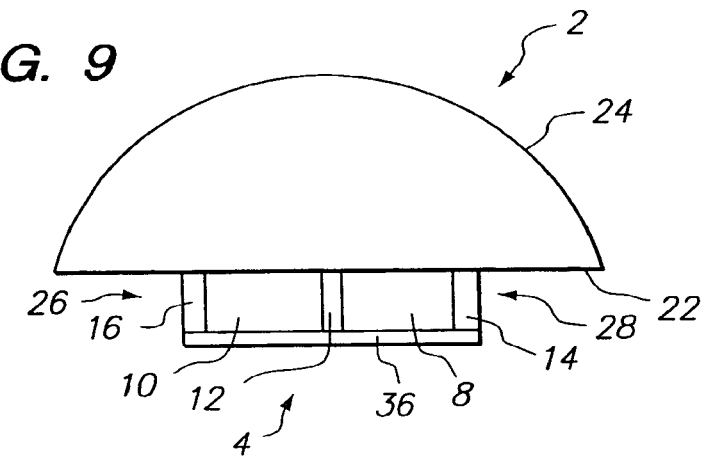
FIG. 9 is a schematic diagram of an optical element bonded directly to a light emitting diode having an active region substantially perpendicular to the optical element.

In the embodiments illustrated in FIGS. 8 and 9, the orientation of n-layer 8, player 10, and active region 12 is substantially perpendicular to optical element 2. As in the embodiments illustrated in FIGS. 6 and 7, no metallization layer is required on optical element 2. In the embodiment illustrated in FIG. 8, optical element 2 is bonded with bonding layer 6 to LED die 4. In the embodiment illustrated in FIG. 9, optical element 2 is directly bonded to LED die 4. In one implementation, LED die 4 is sawn ("diced") from a wafer with cuts made in a direction substantially perpendicular to layers 8 and 10 and to active region 12. In this implementation, the surface of LED die 4 to be bonded to optical element 2 is optionally polished to reduce its roughness. In other implementations, sides 26 and 28 of LED die 4 are beveled, contact 14 and contact 16 are highly reflective, and reflective layer 36 is located to reflect light into optical element 2.

Figure 10:
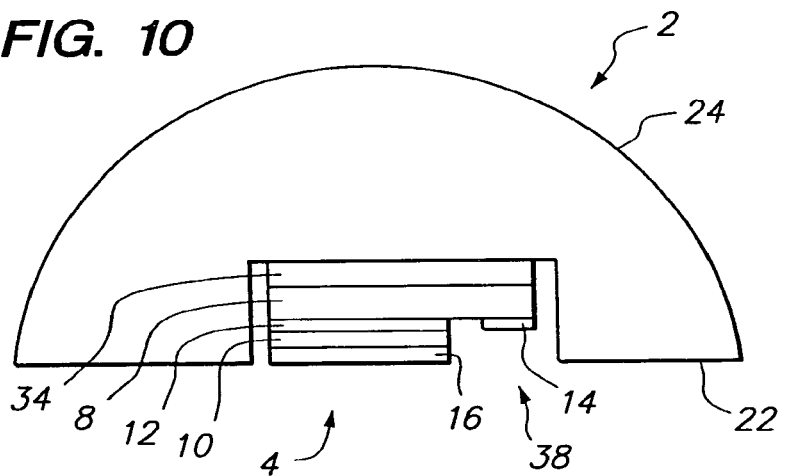
FIG. 10 is a schematic diagram of a light emitting diode located in a recess of a surface of an optical element to which it is directly bonded.
Figure 11:
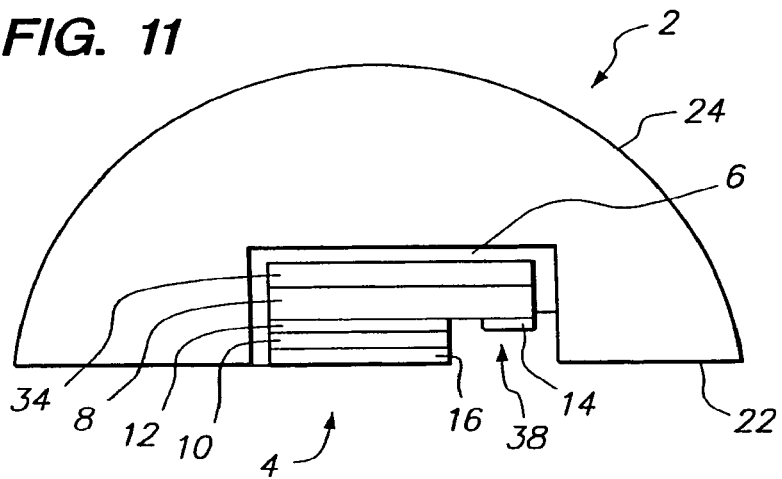
FIG. 11 is a schematic diagram of a light emitting diode located in a recess of a surface of an optical element to which it is bonded with a bonding layer.

In the embodiments of FIGS. 10 and 11, LED die 4 is located in a recess 38 in surface 22 of optical element 2 to which LED die 4 is bonded. In the embodiment illustrated in FIG. 10, optical element 2 is directly bonded to LED die 4. In the embodiment of FIG. 11, optical element 2 is bonded to LED die 4 with bonding layer 6.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A light emitting device having a stack of layers including semiconductor layers comprising an active region, said device comprising:
    a transparent optical element bonded to a surface of the stack by a bonding layer, wherein the transparent optical element does not extend over sides of the stack of layers, and wherein the bonding layer is selected from the group consisting of glass having an optical index greater than 1.8, Schott glass SF59, Schott glass LaSF 3, and Schott glass LaSF N18.

2. The light emitting device of claim 1 wherein a smallest ratio of a length of a base of said optical element to a length of said surface is greater than one.

3. The light emitting device of claim 1 further comprising luminescent material included in the bonding layer.

4. The light emitting device of claim 3 wherein the luminescent material is one of quantum dots and nanocrystals.

5. The light emitting device of claim 1 further comprising luminescent material included in the optical element.

6. A light emitting device having a stack of layers including semiconductor layers comprising an active region, said device comprising:
    a transparent optical element bonded to a surface of the stack by a bonding layer, wherein the bonding layer is selected from the group consisting of metal oxide, tungsten oxide, titanium oxide, nickel oxide, zirconium oxide, indium tin oxide, and chromium oxide.

7. The light emitting device of claim 6 wherein a smallest ratio of a length of a base of said optical element to a length of said surface is greater than one.

8. The light emitting device of claim 6 further comprising luminescent material included in the bonding layer.

9. The light emitting device of claim 8 wherein the luminescent material is one of quantum dots and nanocrystals.

10. The light emitting device of claim 6 further comprising luminescent material included in the optical element.

11. A light emitting device having a stack of layers including semiconductor layers comprising an active region, said device comprising:
    a transparent optical element bonded to a surface of the stack by a bonding layer, wherein the bonding layer includes luminescent material,
    wherein a smallest ratio of a length of a base of said optical element to a length of said surface is greater than one, and wherein the transparent optical element does not extend over sides of the stack of layers.

12. The light emitting device of claim 11 wherein the luminescent material is one of quantum dots and nanocrystals.

13. The light emitting device of claim 11 further comprising luminescent material included in the optical element.

* * * * *